United States Patent
Riedlinger et al.

(10) Patent No.: US 6,285,579 B1
(45) Date of Patent: Sep. 4, 2001

(54) SYSTEM AND METHOD FOR ENABLING/DISABLING SRAM BANKS FOR MEMORY ACCESS

(75) Inventors: Reid James Riedlinger; Donald R. Weiss, both of Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/505,561

(22) Filed: Feb. 17, 2000

(51) Int. Cl.$^7$ ..................................... G11C 11/00
(52) U.S. Cl. ...................... 365/154; 365/203; 365/189.11
(58) Field of Search .................................. 365/154, 203, 365/189.11

(56) References Cited

U.S. PATENT DOCUMENTS 5,926,428 * 1/2000 Rao ......................................... 365/207
6,011,719 * 1/2000 Wang et al. ...................... 365/185.21

* cited by examiner

Primary Examiner—Richard Elms
Assistant Examiner—VanThu Nguyen

(57) ABSTRACT

A system and method are provided which enable a data carrier, such as a BIT line, to be held to a desired value while performing a memory access (e.g., a read or write operation) of SRAM in an efficient manner. In a preferred embodiment, cross-coupled PFETs are implemented to hold the BIT line to a desired value during a memory access of SRAM. As a result, a preferred embodiment enables a BIT line to transition from a high voltage value to a low voltage value free from conflict. That is, in a preferred embodiment, a holder PFET is not attempting to hold the BIT line high, while the SRAM or outside source (e.g., a "writing source") is attempting to drive the BIT line to a low voltage value. Also, in a preferred embodiment, the BIT and NBIT lines (i.e., a complementary data carrier) can be driven to "true" low and "true" high voltage values. Accordingly, in a preferred embodiment, complex circuitry, such as a sense amp, is not required to detect whether a value on the lines is a logic 0 or logic 1. Therefore, a preferred embodiment enables memory access requests (e.g., read and write operations) to be serviced in a more timely manner than is achieved utilizing prior art implementations. Furthermore, a preferred embodiment requires less power consumption than is required for prior art implementations. Moreover, a preferred embodiment utilizes fewer components, and therefore consumes less surface area than in prior art implementations.

20 Claims, 2 Drawing Sheets

SYSTEM AND METHOD FOR ENABLING/DISABLING SRAM BANKS FOR MEMORY ACCESS

RELATED APPLICATIONS

This application is related to co-pending and commonly assigned patent application Ser. No. entitled "MULTI-PORTED REGISTER STRUCTURE UTILIZING A PULSE WRITE MECHANISM," co-pending and commonly assigned U.S. patent application Ser. No. entitled "REGISTER STRUCTURE WITH A DUAL-ENDED WRITE MECHANISM," co-pending and commonly assigned U.S. patent application Ser. No. entitled "METHOD AND SYSTEM FOR PROVIDING A HIGH BANDWIDTH CACHE THAT ENABLES SIMULTANEOUS READS AND WRITES WITHIN THE CACHE," and co-pending and commonly assigned U.S. patent application Ser. No. entitled "SYSTEM AND METHOD UTILIZING SPECULATIVE CACHE ACCESS FOR IMPROVED PERFORMANCE," the disclosures of which are hereby incorporated herein by reference.

TECHNICAL FIELD

This invention relates in general to memory architecture, and in particular to circuitry for enabling/disabling SRAM memory for read/write operations.

BACKGROUND

Static random access memory (SRAM) is commonly utilized in prior art computer systems for storing data. Generally, SRAM memory is a type of memory that is very reliable and very fast. Unlike dynamic random access memory (DRAM), SRAM does not need to have its electrical charges constantly refreshed. As a result, SRAM memory is typically faster and more reliable than DRAM memory. For example, while DRAM supports access times (i.e., the time a program or device takes to locate a single piece of information and make it available to the computer for processing) of about 60 nanoseconds, SRAM of the prior art may provide access times as low as 10 nanoseconds. In addition, SRAM's cycle time (i.e., a measurement of how quickly two back-to-back accesses of a memory chip can be made) is typically much shorter than that of DRAM because it does not need to pause between accesses. Unfortunately, SRAM memory is generally much more expensive to produce than DRAM memory. Due to its high cost, SRAM is typically implemented only for the most speed-critical parts of a computer, such as the memory cache. However, SRAM memory may be implemented for other memory components of a computer system, as well.

FIG. 1 illustrates a typical SRAM cell 100 of the prior art. The SRAM structure of FIG. 1 is a typical 6-T (6 transistor) SRAM cell comprising field effect transistors (FETs) 102, 104, 106, 108, 110, and 112. The SRAM structure 100 of FIG. 1 is well-known in the art and is commonly implemented in integrated circuits of the prior art. The SRAM cell 100 of FIG. 1 is a memory cell capable of storing one bit of data (i.e., a logic 1 or a logic 0). Thus, many of such SRAM cells 100 are typically implemented within a system to provide the desired amount of SRAM memory. As shown, a BIT line, WORD line, and NBIT line are typically included in the structure 100. The BIT line, which may also be referred to herein as a "data carrier," is a line on which data to be read from or written to the SRAM cell 100 is placed, and the NBIT line, which may also be referred to herein as a "complementary data carrier," is the complement (opposite voltage value) of the BIT line. Typically, the BIT line is held to a high voltage level (i.e., a logic 1), unless it is actively pulled to a low voltage level (i.e., a logic 0). For instance, when writing data to the SRAM cell 100, the BIT line is actively driven low by an outside source (e.g., an instruction being executed by the processor) if the outside source desires to write a 0 to the SRAM cell 100. Otherwise, if an outside source desires to write a 1 to the SRAM cell 100, the BIT line remains high. Thereafter, the WORD line is fired (e.g., caused to go to a high voltage level), at which time the value of the BIT line is written into the SRAM cell 100.

When reading data from the SRAM cell 100, the WORD line is fired, and the BIT line is driven by the SRAM cell. That is, the BIT line is pulled low by the SRAM cell 100 if the data stored therein is a 0, and the BIT line remains high if the value stored in the SRAM cell 100 is a 1. More specifically, when reading data from the SRAM cell 100, the BIT line is pulled to a low voltage value by N-channel FET (NFET) 102 if the data stored in the SRAM cell 100 is a 0. However, if the value stored in the SRAM cell 100 is a 1, the BIT line remains at a high voltage value.

Typically, many SRAM cells, such as SRAM cell 100, are connected to a single BIT line. For example, 256 SRAM cells are commonly connected to a single BIT line. As a result, a full rail discharge does not occur quickly on the BIT line when it is pulled to a 0. That is, when the BIT line is being pulled low for a particular SRAM cell, the other 255 SRAM cells connected to the BIT line present more capacitance (i.e., parasitic capacitance) on the BIT line, thereby preventing it from discharging quickly. Thus, for example, if one SRAM cell is attempting to drive the BIT line to a low voltage value (logic 0), the other SRAM cells connected to the BIT line may present capacitance on the BIT line thereby preventing it from fully discharging to a low voltage value quickly. Because the capacitance resulting from the many SRAM cells connected to a BIT line may effect the value that is achieved for a particular SRAM cell, circuitry is required in prior art implementations to detect whether a particular voltage level is a logic 1 or a logic 0. That is, because the BIT line can not fully discharge to provide a "true" 0, circuitry is required to determine whether a detected value on the BIT line is to be interpreted as a 0. Thus, a sense amp is typically utilized in prior art designs to detect whether the value on the BIT line is a logic 1 or a logic 0 by recognizing slight value changes in the BIT line. More specifically, such a sense amp determines whether a value on the BIT line is to be interpreted as a logic 0 or logic 1, and the sense amp then actively converts the value on the BIT line to a "true" logic 0 or logic 1 voltage value. However, implementing a sense amp to correctly detect a logic 1 and logic 0 in such a prior art design is generally a complex and time consuming task. Accordingly, the time required for implementing a sense amp to detect the correct value of the BIT line in prior art implementations effectively increases the cost associated with such prior art implementations. Additionally, the sense amp circuitry itself adds to the cost of the prior art implementation and also consumes valuable surface space within such prior art designs.

In the prior art, SRAM memory is commonly implemented in banks (or "partitions"), with each bank comprising multiple groups of SRAM memory cells. For example, a memory bank of the prior art may comprise four groups of SRAM memory with each group comprising 256 SRAM memory cells 100. Therefore, circuitry is commonly implemented in prior art designs to select a particular group of memory within a memory bank to access (e.g., in order to perform a read or write to a memory cell within the selected group). That is, circuitry is typically implemented in prior art designs to enable and disable a group of SRAM memory for read/write operations. For example, suppose an instruction desires to write data to a particular memory cell located within a first group of a memory bank that comprises four groups of memory cells. Circuitry is typically implemented to enable the first group of SRAM memory cells for read/write operations and disable the remaining three groups of SRAM memory cells.

Turning to FIG. 2A, a typical implementation for enabling/disabling a SRAM memory group is illustrated. As shown, circuitry is coupled to the BIT line of the SRAM structure 100. Even though only SRAM cell 100 is shown, it should be understood that many such SRAM cells may be connected to the BIT line to form a group of SRAM cells. A precharger P-channel FET (PFET) 20 is coupled to the BIT line to precharge the BIT line to a high voltage level. The BIT line is received by an inverter 26, which comprises PFET 10 and NFET 12. The output of inverter 26 is fed back to a PFET holder 22, which works to hold the BIT line to a high voltage level. When a read or write operation is desired for a particular group of SRAM cells, the precharger PFET 20 for that group of SRAM cells is turned off, thereby allowing the BIT line to be utilized for writing/reading data to/from SRAM cells within such group. That is, the precharger PFET 20 is turned off to enable a group of SRAM cells for read/write operations. Otherwise, for the groups of SRAM cells for which a read/write operation is not being performed, the precharger PFETs 20 for such groups remain turned on, thereby disabling such other groups of SRAM cells for read/write operations.

To further illustrate the operation of this prior art design, suppose that a processor is executing an instruction that desires to read the data of SRAM cell 100. Therefore, the precharger PFET 20 is turned off and the WORD line is fired (e.g., transitions to a high voltage value) to read the data from SRAM cell 100. When the WORD line is fired, if a 0 is to be read from the SRAM cell 100, the pull down NFET 102 begins to pull the voltage level of the BIT line down. However, as the pull down NFET 102 attempts to pull down the BIT line, the PFET holder 22 is attempting to hold the BIT line to a high voltage. Accordingly, the PFET holder 22 fights against the pull down NFET 102. This conflict between PFET holder 22 and NFET 102 slows down the speed of the BIT line falling (i.e., slows the transition of the BIT line), thereby increasing the amount of time required to perform the read instruction. Additionally, such conflict increases the power consumption of SRAM 100 because static current is dissipated through the PFET 22 going through the NFET 102 to ground.

As a further example of this prior art design, suppose that a processor is executing an instruction that desires to write data to SRAM cell 100. Because an instruction desires to write to SRAM cell 100, precharger PFET 20 is turned off to enable the group of SRAM cells containing SRAM cell 100. The data to be written to SRAM cell 100 is then placed on the BIT line. That is, the instruction actively drives the BIT line to the value to be written to SRAM cell 100 for read/write operations. Suppose that a 0 is to be written to SRAM cell 100. As the instruction attempts to drive the BIT line to a low voltage value (i.e., to a logic 0), the PFET holder 22 attempts to hold the BIT line to a high voltage. Accordingly, the PFET holder 22 fights against the instruction attempting to pull down the BIT line. This conflict between PFET holder 22 and the instruction attempting to pull down the BIT line slows down the speed of the BIT line falling (i.e., slows the transition of the BIT line), thereby increasing the amount of time required to perform the write instruction. Additionally, such conflict further increases the power consumption of SRAM 100.

It should be recognized that the implementation for the NBIT line of the SRAM structure 100 operates in a similar manner. To illustrate this point further, attention is directed to FIG. 2B. As shown in FIG. 2B, circuitry is coupled to the NBIT line of the SRAM structure 100. Even though only SRAM cell 100 is shown, it should be understood that many such SRAM cells may be connected to the NBIT line to form a group of SRAM cells. A PFET 21 is coupled to the NBIT line to precharge the NBIT line to a high voltage level. The BIT line is received by an inverter 27, which comprises PFET 11 and NFET 13. The output of inverter 27 is fed back to a PFET holder 23, which works to hold the NBIT line to a high voltage level. Accordingly, the problems discussed above for the BIT line, such as the relatively long time required to transition the BIT line to a low voltage value and the added power consumption, are also present for the NBIT line.

As an example, suppose that a processor is executing an instruction that desires to read the data of SRAM cell 100. Therefore, the precharger PFET 21 is turned off and the WORD line is fired to read the data from SRAM cell 100. When the WORD line is fired, if a 1 is to be read from the SRAM cell 100, the BIT line remains at a high voltage value and the NFET 112 begins to pull the voltage level of the NBIT line down. However, as the pull down NFET 112 attempts to pull down the NBIT line, the PFET holder 23 is attempting to hold the NBIT line to a high voltage. Accordingly, the PFET holder 23 fights against the pull down NFET 112. This conflict between PFET holder 23 and NFET 112 slows down the speed of the NBIT line falling (i.e., slows the transition of the NBIT line), thereby increasing the amount of time required to perform the read instruction. Additionally, such conflict increases the power consumption of SRAM 100 because static current is dissipated through the PFET 23 going through the NFET 112 to ground.

As discussed above, prior art designs for enabling/disabling SRAM memory are problematic because such designs require an undesirably long time for a BIT line to transition in response to the WORD line firing. As a result, an undesirably long time is required to perform a read or write instruction to the SRAM memory. Furthermore, such prior art designs for enabling/disabling SRAM memory result in an undesirably high power consumption. Furthermore, because the BIT and NBIT lines do not fully discharge to a low voltage value in prior art implementations, sense amp circuitry is typically required to receive the BIT and NBIT lines and detect the value (i.e., a logic 0 or logic 1) for each line. Such sense amp circuitry is typically complex, and therefore increases the cost of implementing prior art designs. Also, given that such sense amp circuitry is typically relatively large in size, an undesirably large amount of surface area is consumed by the required sense amp circuitry.

Additionally, prior art designs for enabling/disabling SRAM memory require an undesirably large amount of circuitry. For instance, as shown in FIGS. 2A and 2B, such prior art circuitry typically comprises two inverters (i.e., inverter 26 and inverter 27), which each comprise a PFET and a NFET. Additionally, the prior art circuitry further includes two holder PFETs (i.e., holder PFET 22 and holder PFET 21). Accordingly, such prior art design for enabling/disabling SRAM memory, requires six FETs to bold a BIT line and NBIT line for each group of SRAM memory cells implemented. Therefore, if four groups of SRAM memory cells are implemented, a total of 24 FETs are required in the enabling/disabling circuitry to hold the BIT lines and NBIT lines to the proper values. Thus, a relatively large number of components (FETs) are required to be implemented within the prior art design for enabling/disabling SRAM memory. Such a large number of components consumes an undesirably large amount of surface area of a chip and results in an undesirably high cost to implement the design.

SUMMARY OF THE INVENTION

In view of the above, a desire exists for a circuitry for enabling/disabling a group of SRAM cells for read/write operations. A further desire exists for such enabling/disabling circuitry that allows for the BIT line (or NBIT line) of an enabled group to transition to a desired value (e.g., transition from a high to a low voltage value) in a timely manner. That is, a desire exists for a circuit design for enabling/disabling a group of SRAM cells that allow for a BIT line of an enabled group of SRAM memory to transition quickly. More specifically, a desire exists for a design that allows a BIT line to transition quickly, such that read or write instructions to the SRAM memory can be accomplished quickly. A further desire exists for a design for enabling/disabling SRAM memory that consumes less power than was required for prior art designs. Yet a further desire exists for circuitry for enabling/disabling SRAM memory, which allows the BIT line (or NBIT line) to fully discharge to a low voltage value when such line carries a logic 0, thereby eliminating the sense amp circuitry required in prior art designs for detecting the value of the BIT line. Still a further desire exists for circuitry for enabling/disabling SRAM memory, which comprises less circuitry than is required for prior art implementations. Accordingly, a desire exists for an implementation that utilizes fewer components than was required for prior art designs, thereby consuming less surface area and requiring less cost to implement.

These and other objects, features and technical advantages are achieved by a system and method which enable a BIT line to be held to a desired value while performing a memory access (e.g., a read or write operation) of SRAM in an efficient manner. In a preferred embodiment, cross-coupled PFETs are implemented to hold the BIT line to a desired value during a memory access of SRAM. As a result, a preferred embodiment enables a BIT line to transition from a high voltage value to a low voltage value free from conflict. That is, in a preferred embodiment, a holder PFET is not attempting to hold the BIT line high, while the SRAM or outside source (e.g., a "writing source") is attempting to drive the BIT line to a low voltage value. Therefore, a preferred embodiment enables memory access requests (e.g., read and write operations) to be serviced in a more timely manner than is achieved utilizing prior art implementations. Furthermore, a preferred embodiment requires less power consumption than is required for prior art implementations. Moreover, a preferred embodiment utilizes fewer components, and therefore consumes less surface area than in prior art implementations.

In a preferred embodiment, precharger PFETs are utilized to enable/disable a SRAM memory structure for memory access thereof. More specifically, in a preferred embodiment, precharger PFETs are turned on to hold the BIT and NBIT lines for a SRAM structure high when such SRAM structure is disabled for memory access. When the SRAM structure is enabled for memory access request (e.g., an instruction desires to read from or write to such SRAM structure), the precharger PFETs are turned off. When the precharger PFETs are turned off, the BIT or NBIT line can be driven to a low voltage value without conflict from a component (e.g., a holder PFET) attempting to hold the BIT or NBIT line high.

When the SRAM structure is enabled for memory access thereof, a preferred embodiment utilizes cross-coupled PFETs to hold the BIT and NBIT lines to desired values. For instance, in a preferred embodiment, the BIT line is fed to the gate of a first PFET, which has its drain electrically coupled to the NBIT line. Likewise, the NBIT line is fed to the gate of a second PFET, which has its drain electrically coupled to the BIT line. Accordingly, when the BIT line is driven low, it turns on the first PFET, which holds the NBIT line high. Because the NBIT line is held high, the second PFET remains turned off, thereby allowing the BIT line to remain at a low voltage value. Further, when the NBIT line is driven low, it turns on the second PFET, which holds the BIT line high. Because the BIT line is held high, the first PFET remains turned off, thereby allowing the NBIT line to remain at a low voltage value.

In a preferred embodiment, the BIT and NBIT lines can be driven to "true" low and "true" high voltage values. In a preferred embodiment, a relatively few number of SRAM cells are coupled to a single BIT line. For example, in a most preferred embodiment only 32 SRAM cells are coupled to a single BIT line. Therefore, a large parasitic capacitance is not presented to the BIT line by a large number of SRAM cells, as in prior art designs, which allows the BIT and NBIT lines to be discharged to a "true" low voltage value quickly. Of course, it should be understood that in alternative embodiments, any number of SRAM calls may be coupled to a single BIT line. Accordingly, in a preferred embodiment, a sense amp is not required to detect whether a value on the lines is a logic 0 or logic 1. Rather, less complex circuitry that is not required to convert a value to a "true" low or high voltage value may be utilized to receive the BIT and NBIT lines. Therefore, such less complex circuitry may provide a savings in cost and consume less surface space than is required for sense amps typically utilized in prior art implementations.

It should be appreciated that a technical advantage of one aspect of the present invention is that an efficient circuitry for enabling/disabling SRAM memory for memory access is provided. A further technical advantage of one aspect of the present invention is that circuitry is provided that allows for the BIT line (or NBIT line) of SRAM memory enabled for memory access to transition to a desired value (e.g., transition from a high to a low voltage value) in a timely manner. Accordingly, a memory access request, such as a read or write instruction, to the SRAM memory can be accomplished quickly. A further technical advantage of one aspect of the present invention is that a circuit design is provided for enabling/disabling SRAM memory for memory access thereof, which consumes less power than is required for prior art designs. Yet a further technical advantage of one aspect of the present invention is that a circuit design is provided for enabling/disabling SRAM memory for memory access thereof, which allows the BIT line (or NBIT line) to fully discharge to a "true" low voltage value when such line carries a logic 0, thereby eliminating the sense amp circuitry required in prior art designs for detecting the value of the BIT line. Still a further technical advantage of one aspect of the present invention is that a circuit design is provided for enabling/disabling SRAM memory for memory access thereof, which comprises less circuitry than is required for prior art implementations. Accordingly, a circuit design is provided that utilizes fewer components than is required for prior art designs, thereby consuming less surface area and requiring less cost to implement.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 3A:
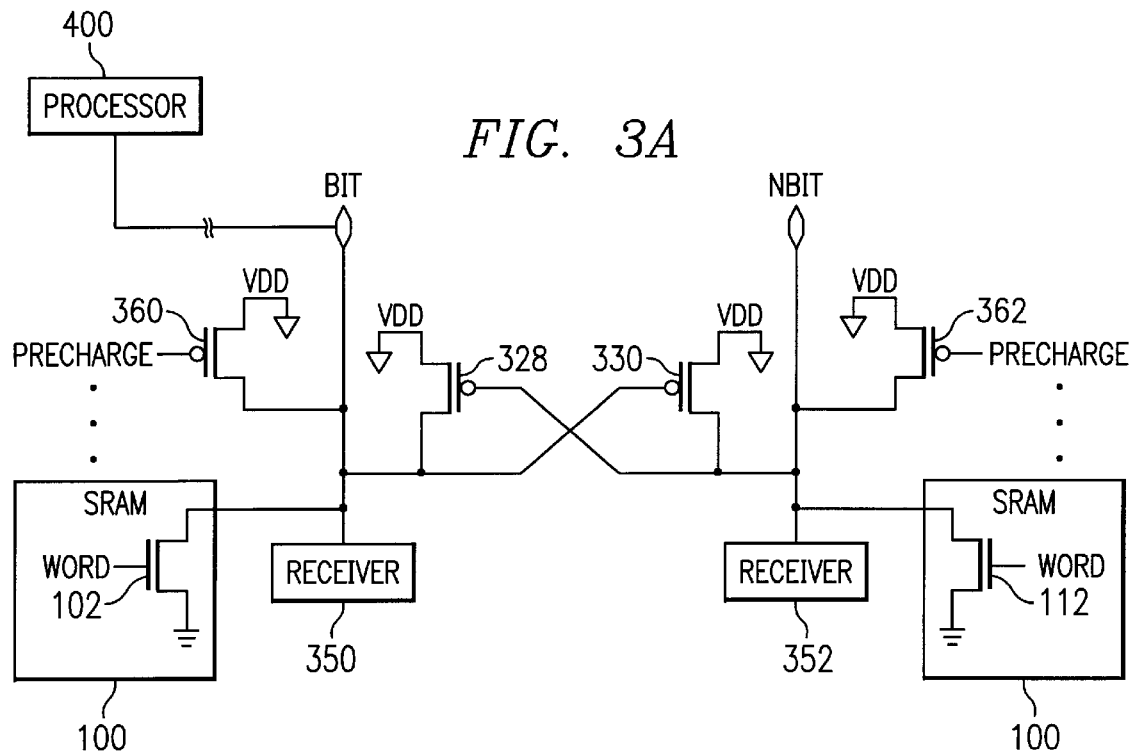
FIG. 3A shows circuitry of a preferred embodiment for enabling/disabling SRAM memory for read/write operations.

Turning to FIG. 3A, a preferred embodiment of the present invention is shown. As shown, a circuitry is implemented for enabling/disabling a group of SRAM memory for memory access requests (e.g., read and write operations). For example, the circuitry shown may be utilized for enabling/disabling a group of SRAM memory cells that includes SRAM cell 100. Even though only SRAM cell 100 is shown as being connected to the BIT line in FIG. 3A, it should be understood that multiple ones of such SRAM cells may comprise a group of SRAM memory cells that are all connected to a single BIT line for such group. In a most preferred embodiment, 32 bits (i.e., 32 SRAM memory cells) are connected to one BIT line. However, in alternative embodiments, any number of SRAM memory cells may be connected to a BIT line, and any such embodiment is intended to be within the scope of the present invention. Because only 32 SRAM cells are connected to a single BIT line in a most preferred embodiment, the amount of parasitic capacitance on the BIT line is SRAM is less than in prior art designs in which many SRAM cells (e.g., 256) are connected to a single BIT line.

As shown in FIG. 3A, a precharger PFET 360 is implemented to precharge the BIT line to a high voltage value. Likewise, a precharger PFET 362 is implemented to precharge the NBIT line to a high voltage value. The precharger PFETs 360 and 362 are turned on when the corresponding group of SRAM memory cells are disabled, and the precharger PFETs 360 and 362 are turned off when the corresponding group of SRAM memory cells are enabled. Thus, if an instruction desires to perform a read or write to a particular SRAM group, the PRECHARGE line for the particular SRAM group goes to a high voltage level, thereby turning the corresponding PFETs 360 and 362 for the SRAM group off. Otherwise, the PRECHARGE line has a low voltage value, which turns the corresponding PFETs 360 and 362 on and disables the corresponding group of SRAM memory cells.

As also shown in FIG. 3A, a preferred embodiment comprises cross-coupled PFETs 328 and 330. PFET 328 has the NBIT line input to its gate, and PFET 330 has BIT input to its gate. Both PFET 328 and PFET 330 have VDD (voltage high) input to their source. PFET 328 has its drain electrically coupled to the BIT line, and PFET 330 has its drain electrically coupled to the NBIT line. As discussed above, when the corresponding group of SRAM memory cells is disabled, the precharge PFETS 360 and 362 are turned on causing the BIT and NBIT lines to be a high voltage value. In this situation, the cross-coupled PFETS 328 and 330 are turned off. That is, the BIT line is input to the PFET 330, and the NBIT line is input to the PFET 328, as shown in FIG. 3A. Thus, when the BIT line has a high voltage level, it causes PFET 330 to turn off. Likewise, when the NBIT line has a high voltage level, it causes PFET 328 to turn off.

To illustrate the operation of a preferred embodiment, suppose the processor 400 is executing an instruction to read data from SRAM cell 100. Therefore, the precharger PFETs 360 and 362 are turned off and the WORD line is fired to read the data from SRAM cell 100. Further suppose that the data to be read from the SRAM cell 100 is a 0, in which case the pull down NFET 102 pulls the voltage level of the BIT line down to a low voltage value (i.e., to a logic 0). In the preferred embodiment shown in FIG. 3A, a PFET holder (such as PFET holder 22 of FIG. 2A) is not fighting against the NFET 102. That is, a PFET holder is not conflicting with the NFET 102 attempting to pull the voltage level of the BIT line to a low voltage value. Therefore, a preferred embodiment enables the BIT line to be discharged to a low voltage value more quickly and with less power consumption than in prior art implementations. Because the time required for the BIT line to transition from a high voltage value to a low voltage value is minimized, the read instruction can be performed faster than is possible in prior art SRAM designs.

It will be understood that, in the above example, when the PRECHARGER line goes high the precharger PFETs 360 and 362 are turned off, thereby enabling the group of SRAM cells that include SRAM cell 100 (e.g., the SRAM cells connected to the BIT line shown in FIG. 3A) for read/write operations. Because the BIT and NBIT lines were previously held to a high voltage level, the cross-coupled PFETs 328 and 330 are initially turned off. Therefore, if the BIT line is pulled to a low value by NFET 102, no conflicting PFET is attempting to hold the BIT line high. As the BIT line goes low, the NBIT line remains high (i.e., the complement of the BIT line). As the BIT line goes low, it turns on PFET 330, which holds the NBIT line high. Because the NBIT line is high, the PFET 328 remains turned off, and therefore does not fight against the BIT line being pulled to a low voltage value.

Figure 3B:
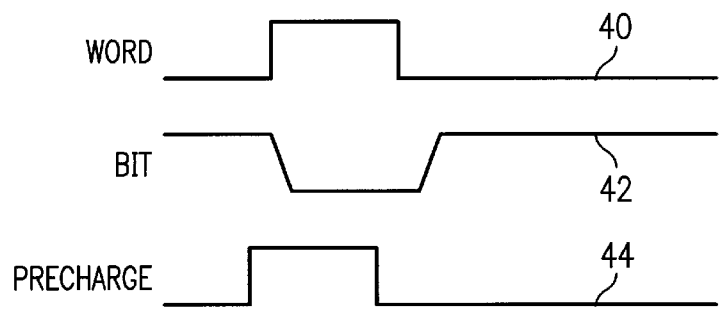
FIG. 3B shows exemplary wave diagrams for the operations of a preferred embodiment.

FIG. 3B illustrates wave traces for the above example of reading a 0 from SRAM cell 100, in a preferred embodiment. As shown, the PRECHARGE line 44 is initially low, which causes the precharge PFETs 360 and 362 to be turned on to hold the BIT and NBIT lines high. Accordingly, the BIT line 42 is initially held to a high voltage value. The WORD line 40 is initially low, but as an instruction desires to read the data from SRAM cell 100, the WORD line 40 fires (i.e., transitions to a high voltage value). Likewise, the PRECHARGE line transitions to a high voltage value, which causes the precharge PFETs 360 and 362 to be turned off, thereby enabling the SRAM memory group that contains the SRAM cell 100 for read/write operations. Because the value stored in the SRAM cell 100 is a 0, the BIT line 42 discharges to a low voltage value. Once the data is read from SRAM cell 100, the WORD line 40 transitions back to a low voltage value. Likewise, the PRECHARGE line 44 transitions back to a low voltage value, which causes the precharge PFETs 360 and 362 to be turned on to hold the BIT and NBIT lines high (thereby disabling the SRAM memory group that contains the SRAM cell 100). Accordingly, as shown in FIG. 3B, BIT line 42 transitions to a high voltage value as the PRECHARGE line causes the precharge PFETs 360 and 362 to be turned on.

As a further example, again suppose the processor 400 is executing an instruction to read data from SRAM cell 100. Therefore, the precharger PFETs 360 and 362 are turned off and the WORD line is fired to read the data from SRAM cell 100. However, suppose now that the data to be read from the SRAM cell 100 is a 1, in which case the pull down NFET 112 pulls the voltage level of the NBIT line down to a low voltage value (i.e., to a logic 0) and the BIT line remains at a high voltage value. In the preferred embodiment shown in FIG. 3A, a PFET holder (such as PFET holder 23 of FIG. 2B) is not fighting against the NFET 112. That is, a PFET holder is not conflicting with the NFET 112 attempting to pull the voltage level of the NBIT line to a low voltage value. Therefore, a preferred embodiment enables the NBIT line to be discharged to a low voltage value more quickly and with less power consumption than in prior art implementations. Because the time required for the NBIT line to transition from a high voltage value to a low voltage value is minimized, the read instruction can be performed faster than is possible in prior art SRAM designs.

It will be understood that, in the above example of reading a 1 from SRAM cell 100, when the PRECHARGER line goes high the precharger PFETs 360 and 362 are turned off, thereby enabling the group of SRAM cells that include SRAM cell 100 (e.g., the SRAM cells connected to the BIT line shown in FIG. 3A) for read/write operations. Because the BIT and NBIT lines were previously held to a high voltage level, the cross coupled PFETs 328 and 330 are initially turned off. Therefore, if the NBIT line is pulled to a low value by NFET 112, no conflicting PFET is attempting to hold the NBIT line high. As the NBIT line goes low, the BIT line remains high (i.e., the opposite of the NBIT line). As the NBIT line goes low, it turns on PFET 328, which holds the BIT line to high voltage level. Because the BIT line remains high, the PFET 330 remains turned off, and therefore does not fight against the NBIT line being pulled to a low voltage value.

As yet a further example of the operation of a preferred embodiment, suppose that a processor 400 is executing an instruction to write data to SRAM cell 100. Because an instruction desires to write to SRAM cell 100, precharger PFETs 360 and 362 are turned off to enable the group of SRAM cells containing SRAM cell 100 for read/write operations. The data to be written to SRAM cell 100 is then placed on the BIT line. That is, an outside source (e.g., the instruction being executed) actively drives the BIT line to the value to be written to SRAM cell 100. Suppose that a 0 is to be written to SRAM cell 100. Thus, an outside source is actively driving the BIT line to a low voltage value (i.e., a logic 0). In the preferred embodiment shown in FIG. 3A, a PFET holder (such as PFET holder 22 of FIG. 2A) is not fighting against the outside source attempting to drive the BIT line low. That is, a PFET holder is not conflicting with the outside source attempting to pull the voltage level of the BIT line to a low voltage value. Therefore, a preferred embodiment enables the BIT line to be discharged to a low voltage value more quickly and with less power consumption than in prior art implementations. Because the time required for the BIT line to transition from a high voltage value to a low voltage value is minimized, the write instruction can be performed faster than is possible in prior art SRAM designs.

It will be understood that, in the above example of writing a 0 to SRAM cell 100, when the PRECHARGER line goes high the precharger PFETs 360 and 362 are turned off, thereby enabling the group of SRAM cells that include SRAM cell 100 (e.g., the SRAM cells connected to the BIT line shown in FIG. 3A) for read/write operations. Because the BIT and NBIT lines were previously held to a high voltage level, the cross coupled PFETs 328 and 330 are initially turned off. Therefore, if the BIT line is pulled to a low value by the outside source (i.e., the "writing source"), no conflicting PFET is attempting to hold the BIT line high. As the BIT line goes low, the NBIT line remains high (i.e., the complement of the BIT line). As the BIT line goes low, it turns on PFET 330, which holds the NBIT line to a high voltage level. Because the NBIT line remains high, the PFET 328 remains turned off, and therefore does not fight against the BIT line being pulled to a low voltage value.

As still a further example of the operation of a preferred embodiment, suppose again that a processor 400 is executing an instruction to write data to SRAM cell 100. Because an instruction desires to write to SRAM cell 100, precharger PFETs 360 and 362 are turned off to enable the group of SRAM cells containing SRAM cell 100 for read/write operations. The data to be written to SRAM cell 100 is then placed on the BIT line. That is, an outside source (e.g., the instruction being executed) actively drives the BIT line to the value to be written to SRAM cell 100. Suppose now that a 1 is to be written to SRAM cell 100. Thus, an outside source is actively driving the BIT line to a high voltage value (i.e., a logic 1), which causes the NBIT line to go to a low voltage value (i.e., a logic 0). In the preferred embodiment shown in FIG. 3A, a PFET holder (such as PFET holder 23 of FIG. 2B) is not fighting against the NBIT line being pulled to a low voltage level. That is, a PFET holder is not conflicting with the NBIT line attempting to be pulled to a low voltage value. Therefore, a preferred embodiment enables the NBIT line to be discharged to a low voltage value more quickly and with less power consumption than in prior art implementations. Because the time required for the NBIT line to transition from a high voltage value to a low voltage value is minimized, the write instruction can be performed faster than is possible in prior art SRAM designs.

It will be understood that, in the above example of writing a 1 to SRAM cell 100, when the PRECHARGER line goes high the precharger PFETs 360 and 362 are turned off, thereby enabling the group of SRAM cells that include SRAM cell 100 (e.g., the SRAM cells connected to the BIT line shown in FIG. 3A) for read/write operations. Because the BIT and NBIT lines were previously held to a high voltage level, the cross coupled PFETs 328 and 330 are initially turned off. Therefore, if the BIT line is driven to a high voltage value by an outside source (i.e., the "writing source") and the NBIT line is pulled to a low value, no conflicting PFET is attempting to hold the NBIT line high. As the NBIT line goes low, the BIT line remains high (i.e., the opposite of the NBIT line). As the NBIT line goes low, it turns on PFET 328, which holds the BIT line to a high voltage level. Because the BIT line remains high, the PFET 330 remains turned off, and therefore does not fight against the NBIT line being pulled to a low voltage value.

As discussed above, the preferred embodiment shown in FIG. 3A provides a circuitry for enabling/disabling a group of SRAM memory cells for read/write operations in a manner that allows the BIT and NBIT lines to transition quickly. As a result, a preferred embodiment allows for read and write instructions to the SRAM to be executed quicker than is achieved in prior art designs. It should be recognized that the preferred embodiment of FIG. 3A provides a circuitry for enabling/disabling a group of SRAM memory cells for read/write operations, which comprises less components than is required in prior art implementations. For instance, the two inverters of the prior art implementation shown in FIGS. 2A and 2B (i.e., inverter 26 and inverter 27), which each comprise two FETs (i.e., PFET 10 and NFET 12, and PFET 11 and PFET 13), and the two holder PFETs (i.e., holder PFETs 20 and 21) are all replaced with cross-coupled FETs 328 and 330 of a preferred embodiment. Accordingly, a preferred embodiment reduces six FETs required in prior art implementations down to only two FETs implemented to accomplish enabling/disabling of SRAM memory for read/write operations. Therefore, four fewer FETs are required in a preferred embodiment than are required for prior art circuitry implementations for enabling/disabling SRAM memory for read/write operations, which results in a savings in cost and less surface area consumption for a preferred embodiment.

As also shown in FIG. 3A, receiver circuitry 350 and 352 receive the BIT and NBIT lines, respectively. In prior art implementations, a sense amp was required to be utilized for such receiver circuitry to actively compare the BIT and NBIT values with a reference value to determine if each is a logic 1 or logic 0, and then output a "true" (or "solid") high or low voltage value. For example, in many digital components a voltage value in the range of 0 to 0.8 V is recognized as a true low voltage value (i.e., a logic 0), while a voltage value in the range of 2 to 5 V is recognized as a true high voltage value (i.e., a logic 1), and in such digital components voltage values between 0.8 and 2 V are undefined (i.e., neither a logic 0 nor logic 1). Thus, in prior art implementations a sense amp is commonly utilized to determine whether the value of the BIT and NBIT lines should be interpreted as a logic 0 or logic 1, and the sense amp actively outputs a "true" low or "true" high voltage value for the lines. For example, a sense amp may recognize that a voltage value of 1.7 on the BIT line is a logic 0, and therefore actively converts the BIT line's value to a "true" logic 0 voltage value (e.g., a value between 0 and 0.8). As discussed above, such sense amps are generally difficult and time consuming to implement within a SRAM enabling/disabling circuitry, which increases the cost associated with utilizing such a sense amp. Additionally, sense amps are typically more expensive and larger in size than other passive components that are not required to actively determine whether a value is a logic high or low and then convert such value to a "true" logic high or low voltage value.

Figure 1:
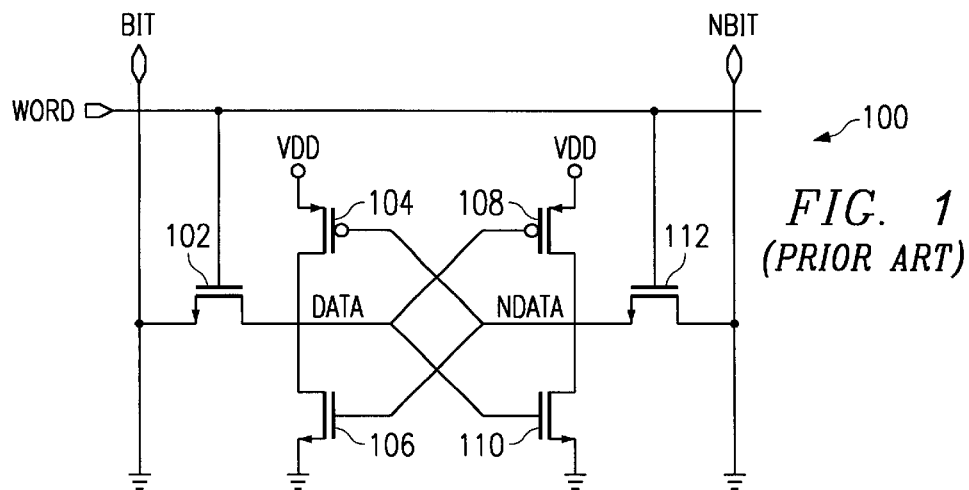
FIG. 1 shows a typical SRAM cell of the prior art.
Figure 2A:
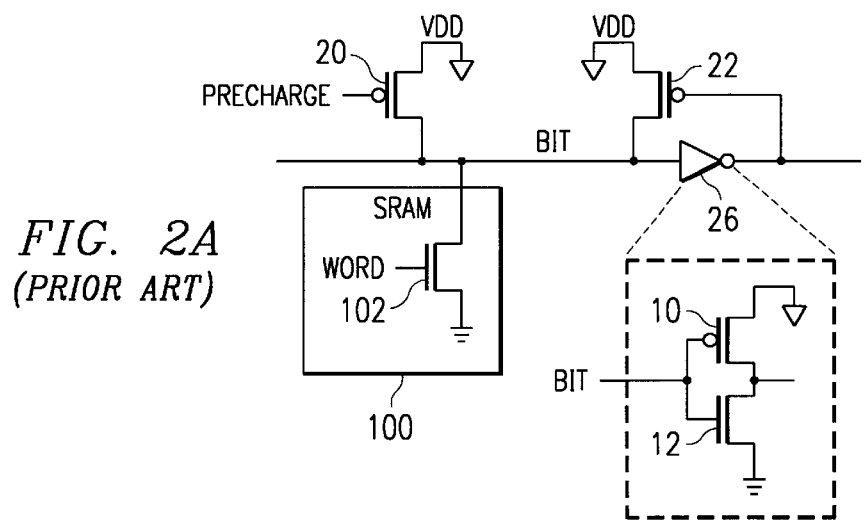
FIG. 2A shows prior art circuitry implemented on the SRAM's BIT line to enable/disable the SRAM memory for read/write operations.
Figure 2B:
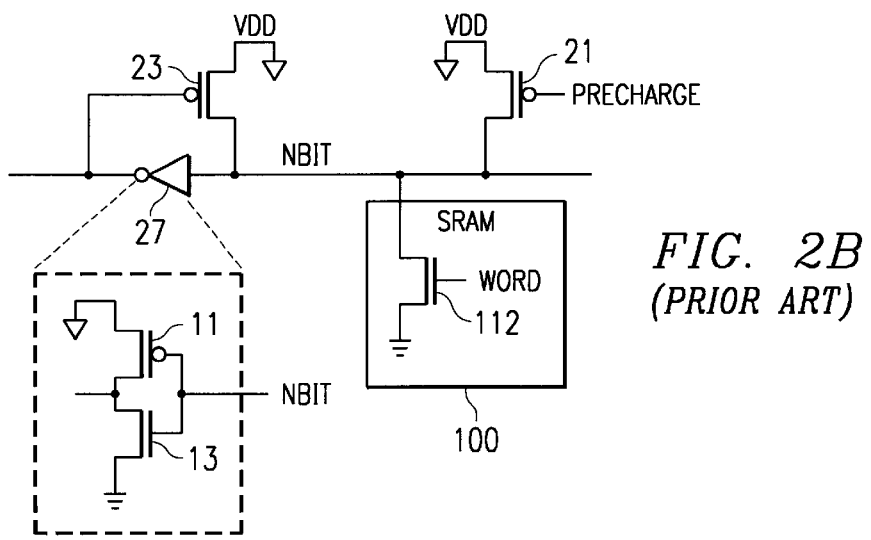
FIG. 2B shows prior art circuitry implemented on the SRAM's NBIT line to enable/disable the SRAM memory for read/write operations.

In a preferred embodiment, the BIT and NBIT lines can be fully discharged to a "true" low voltage value when such lines are set to a logic 0. In a preferred embodiment, a sufficiently low number of SRAM cells are connected to a single BIT line (and to a single NBIT line) such that the SRAM cells do not present such a large parasitic capacitance to the BIT line (and NBIT line) in a manner that prevents the BIT line (and NBIT line) from achieving a true low voltage value quickly. For example, in a most preferred embodiment, 32 SRAM cells are coupled to a single BIT line (and to a single NBIT line). However, it should be understood that in alternative embodiments any number of SRAM cells may be coupled to a single BIT and NBIT line, and any such embodiment is intended to be within the scope of the present invention. Additionally, a holder PFET, such as holder PFETs 22 and 23 of FIGS. 2A and 2B, is not required in a preferred embodiment. Accordingly, a holder PFET is not attempting to hold the BIT or NBIT lines to a high value when the SRAM or an outside source (i.e., a "writing source") is attempting to pull the BIT or NBIT lines down to a low voltage value. Thus, such holder PFETs are not present in a preferred embodiment to prevent the BIT and NBIT lines from achieving a "true" low voltage value.

Because the BIT and NBIT lines are capable of achieving "true" high and low values in a preferred embodiment, a sense amp is not required to be implemented to determine whether the values on the BIT and NBIT lines are a logic 1 or logic 0. Rather, receiver circuitry 50 and 52 may comprise passive components that simply receive the true high and low values of the BIT and NBIT lines and are not required to actively convert a received value to a "true" high or low voltage value. For instance, in a most preferred embodiment, a NAND gate may be utilized for the receiver circuitry 50 and 52. It should be recognized that a passive component, such as a NAND gate, that is not required to actively convert a received value to a "true" high or low voltage value is generally less expensive, less complex, and consumes less surface area than an active sense amp commonly utilized in prior art implementations.

It should be recognized that the SRAM enabling/disabling circuitry of a preferred embodiment may be implemented for any number of SRAM cells 100, which may be connected to a single BIT and NBIT line. In a most preferred embodiment, the SRAM cells 100 are implemented as cache for a processor. However, it should be recognized that the SRAM may be implemented for any desired memory for a computer system, and any such implementation is intended to be within the scope of the present invention. Thus, the SRAM enabling/disabling circuitry of a preferred embodiment is most preferably implemented for SRAM utilized as cache on a microprocessor chip (integrated circuit). However, it should also be understood that the SRAM enabling/disabling circuitry of a preferred embodiment may be implemented for any type of chip (integrated circuit) comprising SRAM memory therein. Furthermore, it should be understood that a preferred embodiment may be implemented within any type of computer system having a processor and SRAM, including but not limited to a personal computer (PC), laptop computer, and personal data assistant (e.g., a palmtop PC).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:

SRAM memory;

means for enabling said SRAM memory for a memory access thereof;

means electrically coupled to said SRAM memory for carrying a data value for a memory access of said SRAM memory; and means for holding said carrying means to said data value while performing a memory access of said SRAM memory when said SRAM memory is enabled for said memory access, wherein said holding means is capable of transitioning said carrying means to said data value without a second holding means attempting to hold said carrying means to a value other than said data value during said transitioning.

2. The circuit of claim 1 wherein said memory access is selected from the group consisting of a read of said data value from said SRAM memory and a write of said data value to said SRAM memory.

3. The circuit of claim 1 wherein said enabling means includes:

a precharge PFET electrically coupled to said carrying means.

4. The circuit of claim 3 wherein said precharge PFET is toggled for enabling and disabling memory access.

5. The circuit of claim 1 wherein said holding means includes cross-coupled PFETs.

6. The circuit of claim 1 further including a complementary carrying means electrically coupled to said SRAM memory for carrying the complement of a data value for a memory access of said SRAM memory.

7. The circuit of claim 6 wherein said carrying means includes a BIT line and said complementary carrying means includes a NBIT line, and wherein said holding means includes:

cross-coupled PFETs, wherein a first one of said cross-coupled PFETs has said BIT line input to its gate and has its drain electrically coupled to said NBIT line, and wherein a second one of said cross-coupled PFETs has said NBIT line input to its gate and has its drain electrically coupled to said BIT line.

8. The circuit of claim 1 wherein said SRAM memory includes multiple SRAM memory cells electrically coupled to said carrying means.

9. The circuit of claim 8 wherein said holding means is capable of transitioning said carrying means to a data value of one of said multiple SRAM memory cells free of conflict with a second holding means.

10. The circuit of claim 1 wherein said second holding means includes a holder FET.

11. A computer system comprising:

a processor for executing instructions; and a SRAM memory structure accessible by said processor to satisfy memory access requests, wherein a data carrier is electrically coupled to said SRAM memory structure, said data carrier capable of carrying a data value for a memory access of said SRAM memory; and circuitry operable to enable and disable said SRAM memory structure for said memory access requests, wherein said circuitry comprises cross-coupled transistors for holding said data carrier for said SRAM memory structure to said data value while performing said memory access.

12. The computer system of claim 11 wherein said memory access requests include read and write requests.

13. The computer system of claim 11 wherein said SRAM memory structure further includes a complementary data carrier electrically coupled to said SRAM memory, said complementary data carrier capable of carrying the complement of a data value for a memory access of said SRAM memory, said cross-coupled transistors further comprising:

cross-coupled PFETs, wherein a first one of said cross-coupled PFETs has said data carrier input to its gate and has its drain electrically coupled to said complementary data carrier, and wherein a second one of said cross-coupled PFETs has said complementary data carrier input to its gate and has its drain electrically coupled to said data carrier.

14. The computer system of claim 11 wherein said circuitry operable to enable and disable said SRAM memory structure is arranged to enable said data carrier to transition to said data value free of conflict.

15. The computer system of claim 14 wherein said circuitry operable to enable and disable said SRAM memory structure is arranged such that no holder FET attempts to hold said data carrier to a different value than said data value during a memory access of said SRAM memory structure.

16. A method of implementing circuitry for enabling and disabling SRAM memory for memory access thereof, said method comprising:

electrically coupling SRAM memory to a BIT line and a NBIT line;

electrically coupling a first precharge component to said BIT line to hold said BIT line high when said SRAM memory coupled to said BIT line is disabled for memory access thereof;

electrically coupling a second precharge component to said NBIT line to hold said NBIT line high when said SRAM memory coupled to said NBIT line is disabled for memory access thereof; and cross-coupling transistors for said BIT line and said NBIT line to hold said BIT and NBIT lines to desired values when said SRAM memory coupled to said BIT and NBIT lines is enabled for memory access thereof.

17. The method of claim 16 wherein said memory access includes read operations and write operations.

18. The method of claim 16 wherein said first precharge component is a PFET, and wherein said second precharge component is a PFET.

19. The method of claim 16 wherein said transistors are PFETs.

20. The method of claim 19 wherein said BIT line is input to a first PFET's gate and said first PFET's drain is electrically coupled to said NBIT line, and wherein said NBIT line is input to a second PFET's gate and said second PFET's drain is electrically coupled to said BIT line.

* * * * *